United States Patent [19]
Eide

[11] Patent Number: 6,028,352
[45] Date of Patent: Feb. 22, 2000

[54] IC STACK UTILIZING SECONDARY LEADFRAMES

[75] Inventor: Floyd K. Eide, Huntington Beach, Calif.

[73] Assignee: Irvine Sensors Corporation, Costa Mesa, Calif.

[21] Appl. No.: 09/095,415

[22] Filed: Jun. 10, 1998

[51] Int. Cl.[7] .................................................. H01L 23/48
[52] U.S. Cl. .......................... 257/686; 257/685; 257/398; 257/696; 257/723; 257/730; 257/666
[58] Field of Search ..................................... 257/696, 676, 257/702, 723, 730, 686, 685, 787, 777, 778, 693, 636, 698, 666

[56] References Cited

U.S. PATENT DOCUMENTS

| | | | |
|---|---|---|---|
| 5,331,235 | 7/1994 | Chun | 257/723 |
| 5,394,608 | 3/1995 | Tottori et al. | 257/724 |
| 5,420,751 | 5/1995 | Burns | 257/719 |
| 5,508,565 | 4/1996 | Hatakeyama et al. | 257/686 |
| 5,543,664 | 8/1996 | Burns | 257/685 |
| 5,561,622 | 10/1996 | Bertin et al. | 257/686 |
| 5,586,009 | 12/1996 | Burns | 257/686 |
| 5,677,569 | 10/1997 | Choi et al. | 257/686 |
| 5,706,172 | 1/1998 | Lee | 257/686 |
| 5,731,633 | 3/1998 | Clayton | 257/668 |
| 5,744,822 | 4/1998 | Jeong et al. | 257/692 |
| 5,744,842 | 4/1998 | Ishii | 257/686 |
| 5,804,874 | 9/1998 | An et al. | 257/686 |
| 5,811,877 | 9/1998 | Miyano et al. | 257/669 |

*Primary Examiner*—Alexander Oscar Williams
*Attorney, Agent, or Firm*—Thomas J. Plante

[57] ABSTRACT

A structure and process are disclosed in which IC chip-containing layers are stacked to create electronic density. Each layer is formed by mechanically and electrically joining an IC-containing TSOP with an external leadframe. Each leadframe contains conductors which are disposed to connect with TSOP leads, transpose signals to other locations on the periphery of the TSOP, and/or connect with other layers in the stack. The TSOP/leadframe layers are stacked and joined, and the leadframe terminals of the lowest layer are disposed to facilitate connection with a PCB or other circuitry.

9 Claims, 3 Drawing Sheets

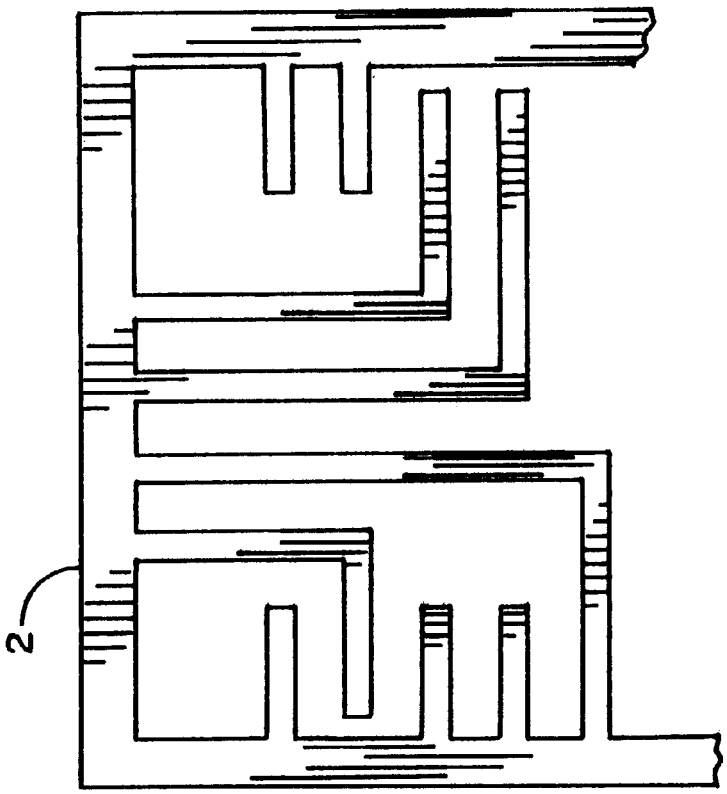
FIG. 2a
FIG. 2b
FIG. 1a
FIG. 1b

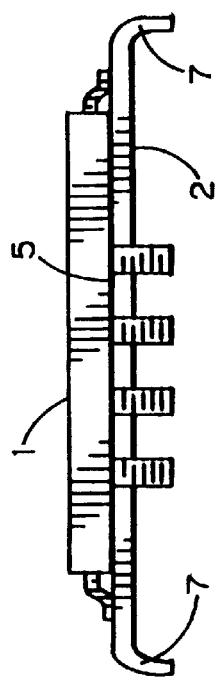
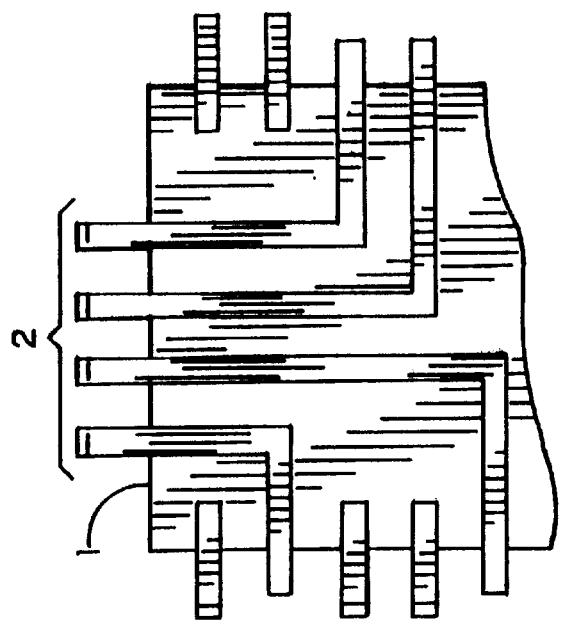
FIG. 4a
FIG. 4b
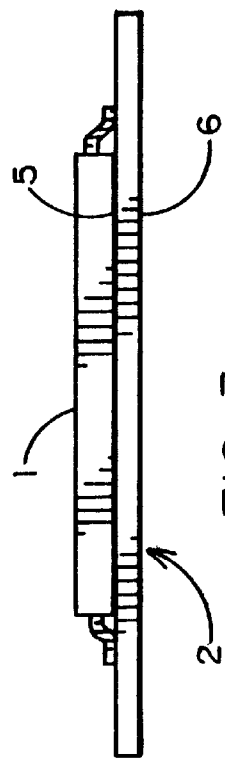
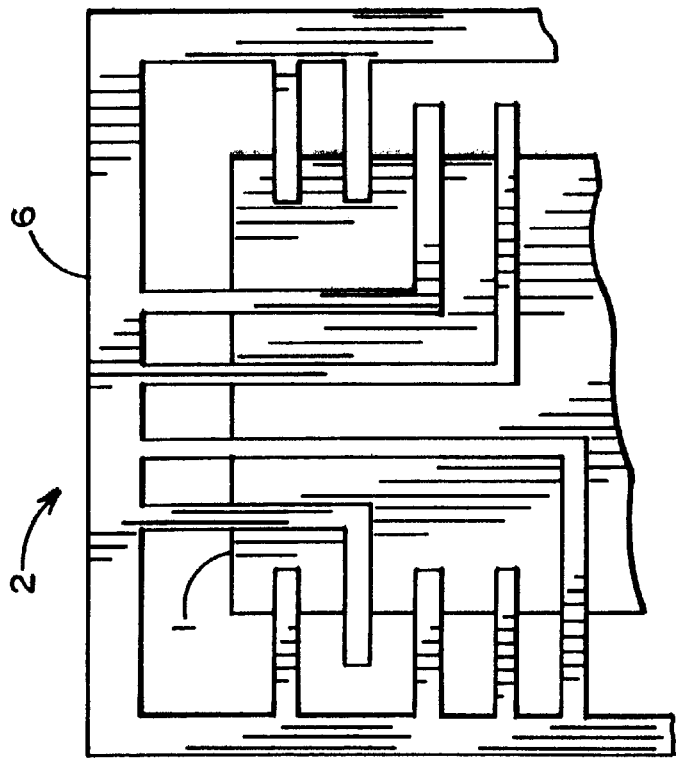
FIG. 3a
FIG. 3b

IC STACK UTILIZING SECONDARY LEADFRAMES

This application claims the benefit of U.S. Provisional Application No. 60/049,580, filed Jun. 13, 1997.

BACKGROUND OF THE INVENTION

This invention relates to the stacking of layers containing IC (semiconductor integrated circuit) chips, thereby obtaining high-density electronic circuitry. In general, the goal of the present invention is to combine high circuit density with reasonable cost. A unique aspect of this invention is that it provides a very low cost method of stacking commercially available IC's in TSOP's (thin small outline packages), while allowing the independent routing of several non-common I/O (input/output) signals from upper-level layers to the base of the stack. Cost reduction is accomplished by utilizing the relatively low cost leadframes and the ability to stack pre-packaged and pre-tested off-the-shelf IC's.

Most of the prior art disclosures describe methods of stacking multiple unpackaged IC chips. Oguchi et al. U.S. Pat. No. 5,332,922, Miyano et al. U.S. Pat. No. 5,440,171, and Choi et al. U.S. Pat. No. 5,677,569 disclose methods of stacking IC chips within a single package. Jeong et al. U.S. Pat. No. 5,744,827 discloses a new type of custom chip packaging which permits stacking, but which does not allow the use of off-the-shelf packaged IC's. Burns U.S. Pat. No. 5,484,959 shows a method of stacking TSOP packages which requires multiple leadframes attached above and below each TSOP and a system of vertical bus-bar interconnections, but which does not conveniently allow an expansion of the number of vertically interconnecting leads.

SUMMARY OF THE INVENTION

This application discloses a stack of IC's electrically interconnected in the vertical direction, suitable for mounting onto a PCB (printed circuit board). This application farther discloses a method for starting with standard TSOP packages and manufacturing a stacked IC-containing package using leadframe interconnections.

A leadframe consists of a metal foil etched to produce conductors of the proper geometry for the desired interconnections, including conductors disposed in the proper geometry for contacting the leads of a standard TSOP. The metal foil includes a border or tie-bar of un-etched metal which performs the functions of holding the etched conductors in their proper geometry during processing and providing dimensionally defined guides for production alignment of the foil with the TSOP, but which tie-bar is trimmed off in a later processing step after its functions are discharged. The leadframe is joined to the TSOP such that the TSOP leads are in solderable contact with their corresponding conductors on the leadframe. The leadframe may be initially joined to the TSOP using adhesive, then high-temperature soldered later, or else may be joined immediately by high-temperature soldering while still being held in alignment. If soldering is done at this stage in the process, the solder should have a higher melting temperature than solders used later in the process. The leadframe is then trimmed and its protruding conductors are formed in a downward direction so that each conductor will form a solderable lap joint with the corresponding conductor on the next lower leadframe. Testing is usually unnecessary because pre-tested TSOP's are normally utilized, but any special testing required may be performed on the TSOP or on the TSOP/leadframe assembly before the TSOP/leadframe assemblies are stacked. Several leadframe/TSOP assemblies may then be stacked and initially joined using adhesive, then high-temperature soldered later, or else they may be joined immediately by high-temperature soldering while still being held in alignment.

The ability to transpose TSOP connections to different leadframe lap joint positions by arranging the geometry of the conductors in the leadframe, the ability to fabricate leadframe leads with finer pitch, and the ability to extend leadframe conductors to all four edges of the leadframe/TSOP assemblies, allow for a higher input/output (I/O) count to accommodate the needs of the stacked IC's.

BRIEF DESCRIPTION OF THE DRAWINGS

FIG. 1a and 1b shows a partial bottom view and an end view of a standard TSOP.

FIG. 2a and 2b shows a partial bottom view and an end view of a representative leadframe.

FIG. 3a and 3b shows a partial bottom view and an end view of a TSOP/leadframe assembly before trimming or forming.

FIG. 4a and 4b shows a partial bottom view and an end view of a TSOP/leadframe assembly after trimming and forming.

DETAILED DESCRIPTION

This invention consists of a stack of IC's electrically and mechanically interconnected in the vertical direction using formed leadframes. The end user of the stack will connect it to a substrate such as a PCB. The vertical placement of IC's will save considerable substrate area in comparison to the conventional horizontal placement of an equivalent number of IC's on the substrate.

In a representative embodiment, each layer within the stack consists of an off-the-shelf commercially available TSOP 1, as shown in FIG. 1, combined with a metal leadframe 2, as shown in FIG. 2, adhesively bonded to the bottom side of the TSOP and soldered to the TSOP leads 3. The leadframe may optionally be bonded to the TSOP using the solder connections only, without adhesive. The leadframe may optionally be a formed metal structure, a layered composite structure, or a nonmetallic conducting structure instead of being an etched metal foil. The purpose of the leadframe is twofold:

1) In some cases the leadframe 2 acts as an extension of the TSOP leads such that the leads of upper TSOP's in the stack can connect with leads of the lower TSOP's having the same pin name.

2) In other cases the leadframe 2 re-routes selected TSOP leads (e.g. lead A4 4) such that after forming they can connect with dummy leads in different locations to bring non-common signals independently to the base of the stack.

As a side benefit the leadframe 2, when sandwiched between TSOP's in the stack, will act as a heat spreader and a thermal sink to take heat away from the TSOP's. In the currently described embodiment, the assembly process for applying the leadframe to the TSOP's and stacking these assemblies consists of the following steps:

1) Fabricate the leadframe as shown in FIG. 2.

2) Apply an epoxy or other type adhesive 5 to the bottom side of the TSOP body.

3) Using an appropriate fixture align the leadframe with the TSOP body and cure the adhesive to fix the leadframe to the bottom of the TSOP body (see FIG. 3).

Figure 5C:
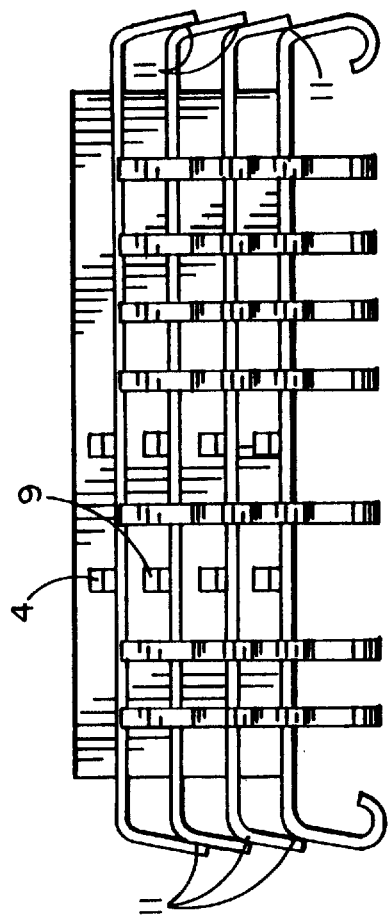
FIG. 5 shows a top view 5a, end view 5b, and side view of a stack 5c of TSOP/leadframe assemblies, illustrating the ability to route the signal paths of selected pins of individual TSOP's separately to the bottom of the stack.
Figure 5A:
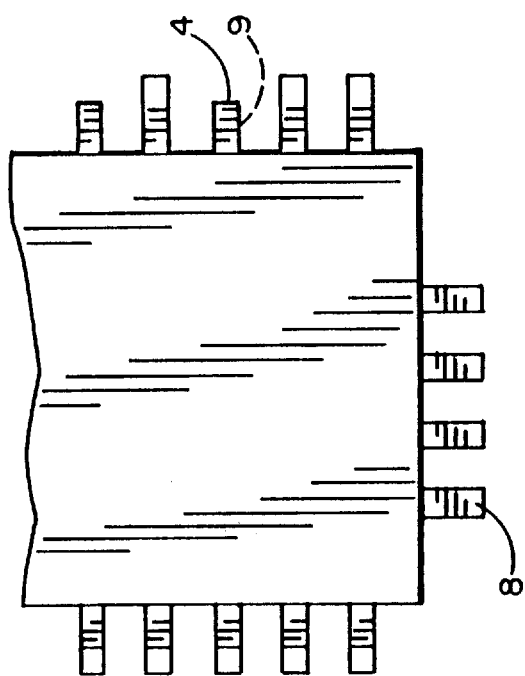
Figure 5B:
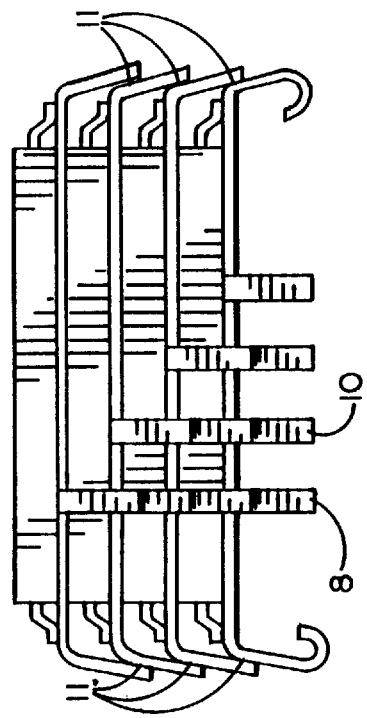

4) Trim the tie bar 6 from the leadframe (see FIG. 4) and form the leads in a downward direction 7 outside of the TSOP leads such that when stacked the leadframe leads will form a lap joint with the leadframe of the lower TSOP in the stack (see FIG. 5). Alternatively, the leadframe leads may be formed into any other configuration, such as a "C" configuration (see FIG. 6) suitable for stacking. In the case of the leadframe attached to the bottom of the bottom TSOP in the stack the leads may be formed into any configuration, such as a configuration (e.g., gull wing, J-lead) to provide stress relief when the stack is soldered to a substrate. Further, since the bottom leadframe is not sandwiched between two TSOP's an optional polyimide layer may be adhesively bonded to the bottom TSOP to strengthen the lead to TSOP body attachment.

5) Apply an epoxy or other type adhesive to the top surface of each TSOP to be stacked, excepting the top TSOP in the stack.

6) Using an appropriate fixture align the TSOP's with leadframes attached and cure the adhesive fixing each TSOP in the stack. Optionally the leadframes may be joined to the TSOP's with high temperature solder while in the alignment fixture, making the adhesive unnecessary.

7) Dip each edge of the stack having leads into a molten solder pot. This will solder both the TSOP leads to the leadframe and each lead of the leadframe to the leadframe lead of the TSOP beneath it in the stack (see FIG. 5). The solder used for dipping should have a high melting temperature such that the solder joints so formed do not reflow when the user solders the stack to a substrate. If the TSOP's have been previously joined to the leadframes by soldering, the solder used for that operation should have an even higher melting temperature such that those solder joints do not reflow when the stack of leadframes is joined by dipping.

In an alternative embodiment, the leadframe is fabricated from a PCB by etching the desired conductors, then etching away the periphery of the PCB dielectric to expose the outer leads of the leadframe. In this alternative embodiment, the remaining PCB dielectric holds the lead conductors in proper orientation, thus substituting for the border or tie-bar of the previous embodiment.

What is unique about this invention is that it provides a very low cost method of stacking commercially available IC's in TSOP packages, such as IC memories. It also allows for routing several non-common input/output signals such as chip enable, and/or data lines from upper level TSOP's to the base of the stack independent from the lower level TSOP signals. FIG. 5 demonstrates a case where the leads "A" of each TSOP in the stack are brought down independently to different leads at the base of the stack. In this example, Lead "A" of the fourth TSOP 4 (designated "A4" in FIG. 5) is brought out at lead "A4" 8 at the base of the stack, lead "A" of the third TSOP 9 (designated "A3" in FIG. 5) is brought out to lead "A3" 10 at the base of the stack, etc. If the leads "A" were the individual chip enable pins of IC memory TSOP's, the end user of the stack could address each IC memory TSOP in the stack independently. Similarly, data lines from the bottom two memory IC TSOP's could be routed down the side of the stack while data lines from the two top TSOP's could be routed to and down the ends of the stack. As an example, this could make the memory bit width of the stack twice that of the individual TSOP's.

Figure 6:
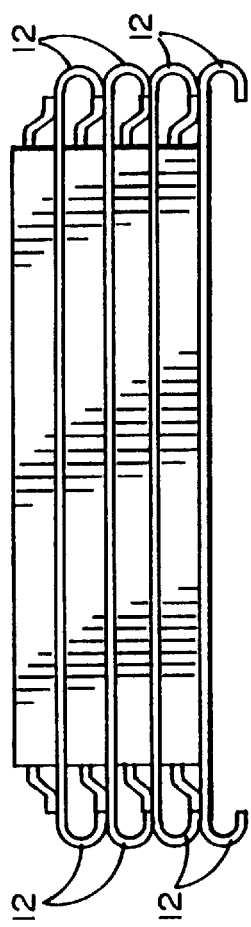
FIG. 6 shows an end view of a stack of TSOP/leadframe assemblies with "C" leads.

FIG. 5 illustrates the lap joint 11 as a method of disposing the leads in the stack in solderable configuration, while FIG. 6 illustrates an alternative embodiment utilizing a "C" lead configuration 12 to dispose the leads in the stack in solderable configuration.

From the foregoing description, it will be apparent that the device and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A stack of IC chip-enclosing layers, in which a plurality of the layers each comprises:
    (a) a package containing at least one IC chip, material encapsulating the chip, I/O terminals on the chip, and separate electrical leads extending from separate I/O terminals beyond the chip-encapsulating material, with the ends of said leads bent downwardly toward the base of the package; and
    (b) a secondary separately formed conductive leadframe secured to the bottom of the package, said leadframe providing a plurality of independent electrical leads to which separate leads from the IC chips are soldered, and said leadframe having a plurality of outwardly extending arms all bent downwardly toward the next lower layer and secured by solder to the arms extending from the secondary leadframe of said next lower layer.

2. The stack of IC chip-enclosing layers of claim 1, in which some of the solder connected electrical leads electrically interconnect all of the layers in the stack, other such leads electrically connect only to some of the layers in the stack, and yet other such leads electrically connect only to a single layer in the stack.

3. The stack of IC chip-enclosing layers of claim 1, in which each chip-containing package is an off-the-shelf TSOP package.

4. The stack of IC chip-enclosing layers of claim 1, which contains two or more such layers.

5. The stack of IC chip-enclosing layers of claim 1, in which the secondary leadframes include:
    a) some terminals that route signals from the package leads on the same layer to peripheral locations on any side of the stack, and
    b) other terminals that serve the purpose of bussing signals to the base of the stack, which signals do not come from package leads on the same layer.

6. The stack of IC chip-enclosing layers of claim 1, in which the downwardly bent arms of the secondary leadframes provide bussing connections on at least three sides of the stack.

7. The stack of IC chip-enclosing layers of claim 1, in which each secondary leadframe has a lead-supporting layer formed from dielectric material.

8. The stack of IC chip-enclosing layers of claim 7, in which the layer formed from dielectric material is flexible.

9. The stack of IC chip-enclosing layers of claim 1, in which each secondary leadframe has a peripheral tie-bar to retain the separate leads in position until the secondary leadframe has been secured to its IC-chip containing package.

* * * * *

UNITED STATES PATENT AND TRADEMARK OFFICE
CERTIFICATE OF CORRECTION

| | |
|---|---|
| PATENT NO. | : 6,028,352 |
| APPLICATION NO. | : 09/095415 |
| DATED | : February 22, 2000 |
| INVENTOR(S) | : Floyd K. Eide |

It is certified that error appears in the above-identified patent and that said Letters Patent is hereby corrected as shown below:

ON THE COVER PAGE: The following priority information is to be added:

Related U.S. Application Data

(60)  Provisional application No. 60/049,580, filed on Jun. 13, 1997.

Signed and Sealed this

Fourth Day of August, 2009

JOHN DOLL
*Acting Director of the United States Patent and Trademark Office*